US007494346B1

(12) United States Patent
Peng

(10) Patent No.: US 7,494,346 B1
(45) Date of Patent: Feb. 24, 2009

(54) BOARD-TO-BOARD CONNECTOR ASSEMBLY

(75) Inventor: Yung-Chi Peng, Tu-Cheng (TW)

(73) Assignee: Cheng Uei Precision Industry Co., Ltd., Taipei Hsien (TW)

( * ) Notice: Subject to any disclaimer, the term of this patent is extended or adjusted under 35 U.S.C. 154(b) by 0 days.

(21) Appl. No.: 11/987,924

(22) Filed: Dec. 6, 2007

(51) Int. Cl.
*H01R 12/00* (2006.01)
*H05K 1/00* (2006.01)

(52) U.S. Cl. .......................................... 439/74; 439/66

(58) Field of Classification Search ................... 439/66, 439/65, 83, 81, 74, 75
See application file for complete search history.

(56) References Cited

U.S. PATENT DOCUMENTS 7,037,117 B2 * 5/2006 Goto .......................... 439/74

* cited by examiner

*Primary Examiner*—Javaid Nasri
(74) *Attorney, Agent, or Firm*—Rosenberg, Klein & Lee

(57) ABSTRACT

A board-to-board connector assembly includes a receptacle having a receptacle housing and female contacts. The receptacle housing has a fundus and two first sidewalls defining female cavities therein. The female cavity has a first branch cavity defined transversely in the top of the first sidewall, a second branch cavity defined in the inside of the first sidewall, a third branch cavity extending downward from the first branch cavity. The female contact mounted in the female cavity has a base extending transversely. One end of the base extends downward and then bends upward to form a contacting portion. A soldering portion extends downward from the base and form a soldering head for being soldered on a printed circuit board. The base is received in the first branch cavity, the contacting portion is received in the second branch cavity, the soldering portion is received in the third branch cavity.

12 Claims, 6 Drawing Sheets

BOARD-TO-BOARD CONNECTOR ASSEMBLY

BACKGROUND OF THE INVENTION

1. Field of the Invention

The present invention generally relates to a board-to-board connector assembly, and more particularly to a connector assembly having a receptacle and a plug capable of avoiding a fail electrical connection caused by affection of the superfluous soldering tin.

2. The Related Art

In the field of the electronics industry, in order to electrically connect two parallel printed circuit boards, it is necessary to provide a surface mount miniature board-to-board connector assembly which is composed of a receptacle with a plurality of female contacts and a plug with a plurality of male contacts. One end of the female and male contacts engages with each other, the other end of the female and male contacts connects to the corresponding printed circuit board respectively.

Please referring FIG. 10, a board-to-board connector includes a housing and a plurality of female contacts received in the housing. The housing has a bottom board 31, a pair of first sidewalls 32 extending longitudinally, and a pair of second sidewalls (not shown) extending transversely. The middle of the bottom board 31 protrudes upward to form a rib 34, a recess 35 is formed among the first sidewalls 32, the second sidewalls and the rib 34. The housing defines a plurality of cavities, each cavity has a first branch cavity 371 extending transversely defined in the bottom of the bottom board 31, a second branch cavity 372 defined inside the first sidewall 32 and extending vertically to communicate with the first branch cavity 371, and a third branch cavity 374 extending vertically defined in a side surface of the rib 34 and communicating with the recess 35 and the inside of the first branch cavity 371.

The contact has a base 41 extending transversely received in the corresponding first branch cavity 371, a soldering portion 42 extending downward from the outside of the base 41 and extending out from the first branch cavity 371 for being soldered on a printed circuit board (not shown), and a fixing portion 43 extending upward from the junction of the base 41 and the soldering portion 42 and received in the corresponding second branch cavity 372, and a contacting portion 45 extending upward from the inside of the base 41 and received in the corresponding third branch cavity 374. The top of the contacting portion 45 extends towards the recess 35 to form a contacting head 47.

However, when the soldering portion 42 of the contact is soldered on the printed circuit board by soldering tin, the superfluous soldering tin may flow to the contacting portion 45 and the contacting head 47 along the base 41, then a fail electrical connection is resulted between the contact and a mating contact of a plug.

SUMMARY OF THE INVENTION

An object of the present invention is to provide a board-to-board connector assembly capable of avoiding a fail electrical connection caused by affection of the superfluous soldering tin.

The board-to-board connector assembly in accordance with the present invention comprises a receptacle and a plug. The receptacle has a receptacle housing and a plurality of female contacts mounted in the receptacle housing. The receptacle housing has a fundus, two first sidewalls protruding upward from two opposite sides of the fundus, and two second sidewalls protruding upward from two opposite ends of the fundus, a recess formed among the fundus and the sidewalls, female cavities defined in the first sidewall. The female cavity has a first branch cavity defined transversely in the top of the first sidewall, a second branch cavity defined in the inside of the first sidewall and communicating with the first branch cavity and the recess, a third branch cavity extending downward to pass through the bottom of the first sidewall from the first branch cavity and defined in the outside of the first branch cavity. The female contact is mounted in the female cavity of the receptacle housing and has a base extending transversely. One end of the base extends downward and then bends upward to form a contacting portion. The base extends downward to form a soldering portion at the outside of the contacting portion. The bottom of the soldering portion bends sideward to form a soldering head for being soldered on a printed circuit board. The base is received in the first branch cavity, the contacting portion is received in the second branch cavity and stretches into the recess, the soldering portion is received in the third branch cavity. The plug has a plug housing engaging the recess of the receptacle housing and male contacts received in the plug housing and against the contacting portion of the female contact.

As described above, because the contacting portion and the soldering portion are insulated by the first sidewall, the superfluous soldering tin is lead to the outside by the soldering portion and the third branch cavity when the soldering head is soldered on the printed circuit board by soldering pin. Therefore, the superfluous soldering tin do not flow to the contacting portion, avoiding a fail electrical connection between the male contact and the female contact.

BRIEF DESCRIPTION OF THE DRAWING

The present invention will be apparent to those skilled in the art by reading the following description of an embodiment thereof, with reference to the attached drawing, in which.

DETAILED DESCRIPTION OF THE PREFERRED EMBODIMENT

Figure 1:
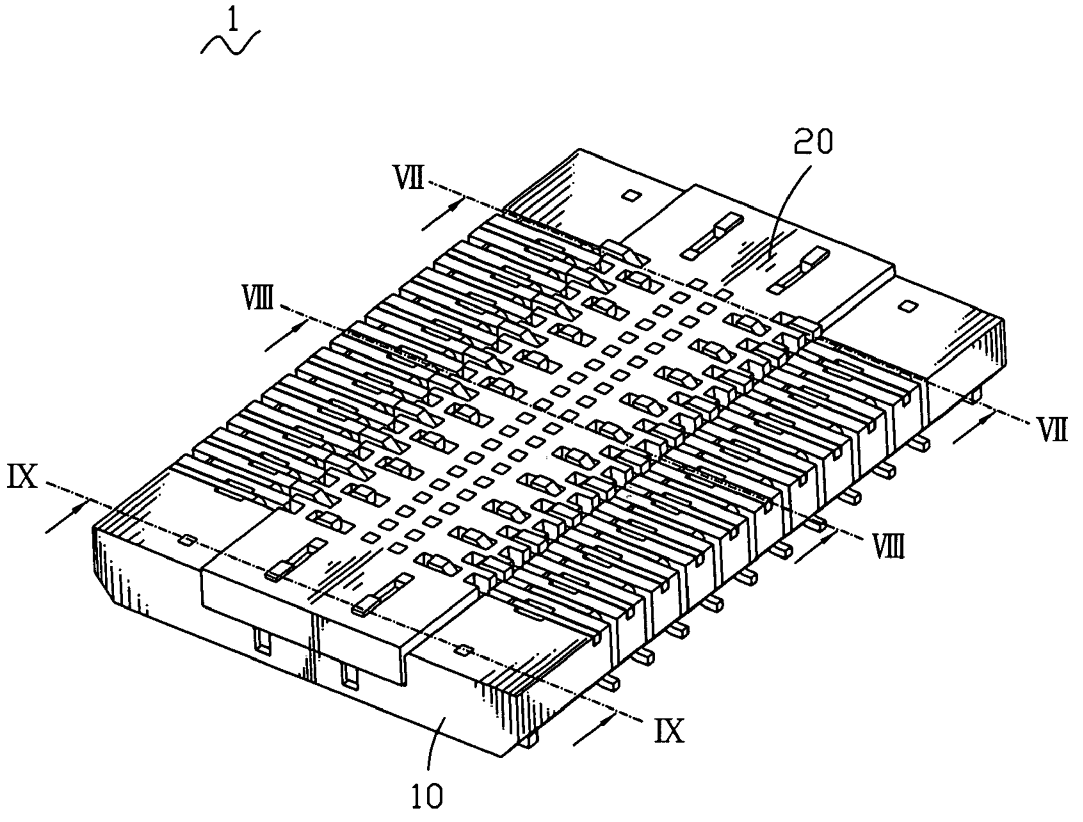
FIG. 1 is a perspective view of a board-to-board connector assembly in accordance with the present invention.
Figure 2:
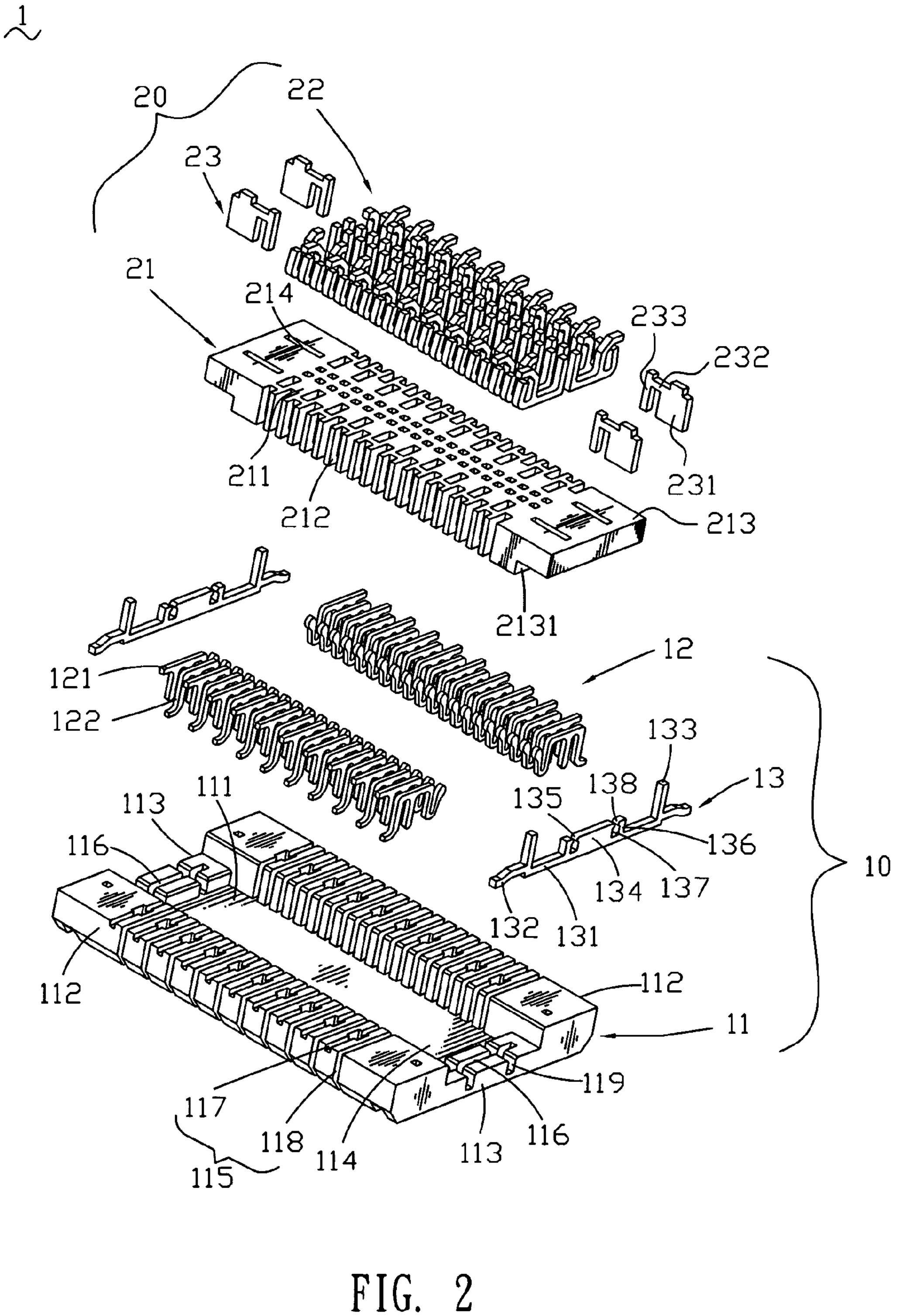
FIG. 2 is an exploded perspective view of the board-to-board connector assembly.

Referring now to FIG. 1 and FIG. 2, a board-to-board connector assembly 1 in accordance with the present invention is shown. The connector assembly 1 is composed of a receptacle 10 and a plug 20 which are respectively of flat configurations for surface mounting on individual printed circuit boards (not shown) to interconnect circuits on the boards.

As shown in FIG. 2, the receptacle 10 comprises a receptacle housing 11, a female contact group 12, and two first fixing contacts 13 received in the receptacle housing 11 respectively.

The receptacle housing 11 is of a flat rectangular configuration to have a fundus 111. Two opposite sides of the fundus 111 protrude upward to form a pair of first sidewalls 112 extending longitudinally, each first sidewall 112 defines two end portions at two ends thereof, two second sidewalls 113 extending transversely are disposed between the corresponding end portions of the first sidewalls 112 respectively, the second sidewall 113 is lower than the first sidewall 112, a recess 114 is formed among the sidewalls and the base 111. The first sidewall 112 defines a plurality of female cavities 115 arranged at regular intervals along the longitudinal direction of the fundus 111 for receiving the female contact group 12 therein. The female cavity 115 communicates with the recess 114 for allowing the female contact group 12 to stretch into the recess 114. Two ends of the receptacle housing 11 define a first fixing cavity respectively, the first fixing cavity has a basic cavity 116 defined transversely in the second sidewall 113 and the end portions of the two first sidewalls 112 and passing through the top of the second sidewall 113, two parallel middle cavities 119 defined longitudinally in the top of the second sidewall 113 and intersecting with the basic cavity 116, and two side holes 110 defined in the end portions of the first sidewalls 112 and communicating with the basic cavity 116.

Figure 3:
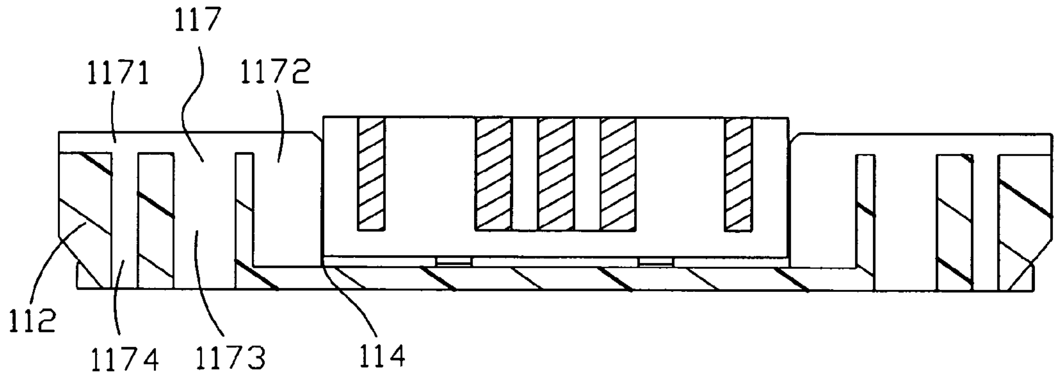
FIG. 3 is a cross-sectional view of the assembly of a receptacle housing and a plug housing for clearly showing a first cavity of the receptacle housing.
Figure 4:
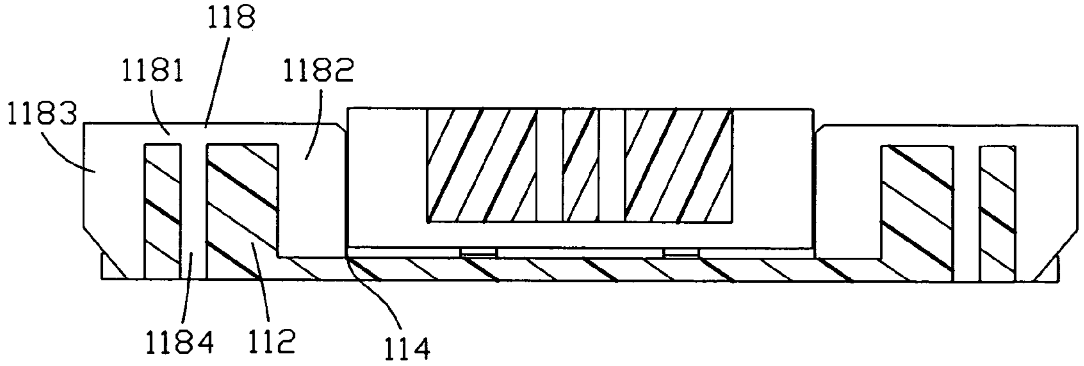
FIG. 4 is a cross-sectional view of the assembly of the receptacle housing and the plug housing for clearly showing a second cavity of the receptacle housing.

Referring to FIG. 3 and FIG. 4, the male cavities 115 include a plurality of first cavities 117 and second cavities 118. The first cavity 117 has a first branch cavity 1171 defined transversely in the top of the first sidewall 112, a second branch cavity 1172 defined in the inside of the first sidewall 112 and communicating with the first branch cavity 1171 and the recess 114, a fourth branch cavity 1174 extending downward from the outside of the first branch cavity 1171 and apart from an outer surface of the first sidewall 112, and a third branch cavity 1173 defined between the second branch cavity 1172 and the fourth branch cavity 1174 and communicating with the first branch cavity 1171.

The second cavity 118 has a first partial cavity 1181 defined transversely in the top of the first sidewall 112, a second partial cavity 1182 defined in the inside of the first sidewall 112 and communicating with the first partial cavity 1181 and the recess 114, a third partial cavity 1183 extending downward from the outside of the first partial cavity 1181 and communicating with the outside, and a fourth partial cavity 1184 defined between the second partial cavity 1182 and the third partial cavity 1183 and communicating with the first partial cavity 1181.

Figure 5:
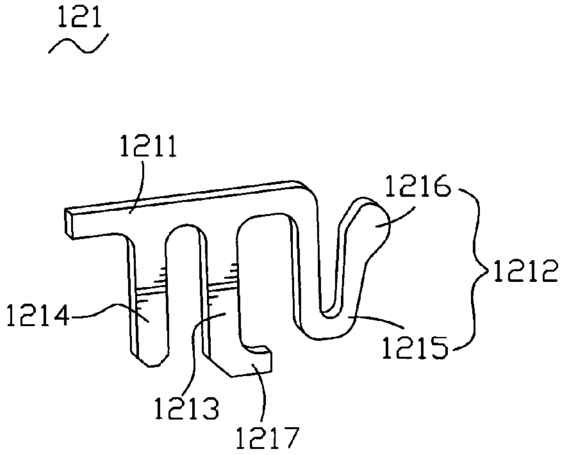
FIG. 5 is a perspective view of a first contact of the receptacle.
Figure 6:
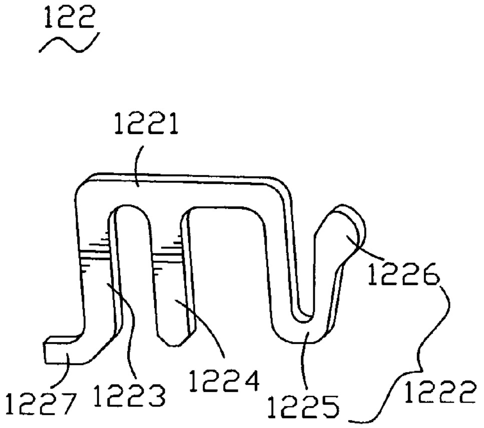
FIG. 6 is a perspective view of a second contact of the receptacle.

Refereeing to FIG. 5 and FIG. 6, the female contact group 12 has a plurality of first contacts 121 and a plurality of second contacts 122. The first contact 121 has a first base 1211 extending transversely, one end of the first base 1211 extends downward and then bend upward to form a first elastic portion 1215, the top of the first elastic portion 1215 protrudes towards one side opposite to the first base 1211 to form a first contacting head 1216, the first elastic portion 1215 and the first contacting head 1216 forms a first contacting portion 1212. The first base 1211 extends downward at a place close to the other end thereof to form a first fixing portion 1214. A first soldering portion 1213 extends downward from the first base 1211 and is located between the first contacting portion 1212 and the first fixing portion 1214, the bottom of the first soldering portion 1213 bends toward the first contacting portion 1212 to form a first soldering head 1217.

The second contact 122 has a second base 1221 extending transversely, one end of the second base 1221 extends downward and then bend upward to form a second elastic portion 1225, the top of the second elastic portion 1225 protrudes towards one side opposite to the second base 1221 to form a second contacting head 1226, the second elastic portion 1225 and the second contacting head 1226 forms a second contacting portion 1222. The second base 1221 extends downward at the other end thereof to form a second soldering portion 1223, the bottom of the second soldering portion 1223 bends toward one side opposite to the second contacting portion 1222 to form a second soldering head 1227. A second fixing portion 1224 extends downward from the second base 1221 and is located between the second contacting portion 1222 and the second soldering portion 1223.

Please Referring to FIG. 2 again, the first fixing contact 13 has a first basic portion 131 extending transversely to form a strip shape, two sides of the first basic portion 131 extend outward to form two welding portions 132, the junction of the first basic portion 131 and the welding portion 132 extends upward to form a first inserting portion 133. The middle of the first basic portion 131 protrudes upward to form a fixing board 134, the top of two sides of the fixing board 134 protrudes outward to form two first thorns 135. Two fixing pillars 136 protrude upward from the first basic portion 131 and are adjacent to the two sides of the fixing board 134, two fixing spaces 137 are formed between the fixing board 134 and the two fixing pillars 136, the top of the fixing pillar 136 protrudes into the fixing space 137 to form a second thorn 138.

Figure 7:
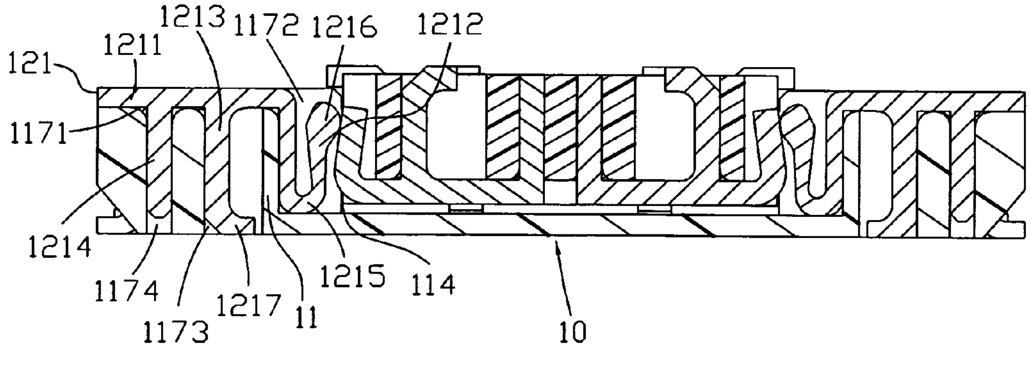
FIG. 7 is a cross-sectional view of the board-to-board connector assembly for clearly showing the first contact received in the first cavity of the receptacle housing.
Figure 8:
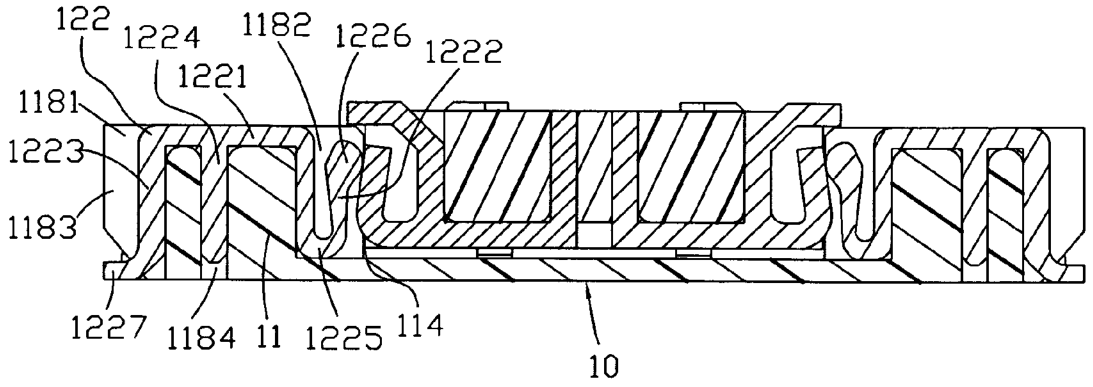
FIG. 8 is a cross-sectional view of the board-to-board connector assembly for clearly showing the second contact received in the second cavity of the receptacle housing.

As shown in FIG. 7 and FIG. 8, when the receptacle 10 is assembled, the first contacts 121 and the second contacts 122 are respectively received in the corresponding first cavities 117 and second cavities 118. The first base 1211 is received in the first branch cavity 1171, the first elastic portion 1215 is received in the second branch cavity 1172, the first contacting head 1216 stretches into the recess 114, the first fixing portion 1214 is received in the fourth branch cavity 1174, the first soldering portion 1213 and the first soldering head 1217 are received in the third branch cavity 1173. The second base 1221 is received in the first partial cavity 1181, the second elastic portion 1225 is received in the second partial cavity 1182, the second contacting head 1226 stretches into the recess 114, the second soldering portion 1223 and the second soldering head 1227 are received in the third partial cavity 1183, the second fixing portion 1224 is received in the fourth partial cavity 1184. The first fixing contact 13 is received in the first fixing cavity. The first basic portion 131, the welding portions 132, the fixing board 134 and the fixing pillars 136 are fixed in the basic cavity 116, the first inserting portions 133 are inserted into the side holes 110.

When the receptacle 10 is soldered on the corresponding printed circuit board, the first soldering head 1217 and the second soldering head 1227 are soldered on corresponding places of the printed circuit board. Because the first contacting portion 1212 and the first soldering portion 1213 are insulated by the first sidewall 112, the superfluous soldering tin is lead to the outside by the first soldering portion 1213 and the third branch cavity 1173 when the first soldering head 1217 is soldered on the printed circuit board by soldering pin. In the same way, the superfluous soldering tin is lead to the outside by the second soldering portion 1223 and the third partial cavity 1183 when the second soldering head 1227 is soldered on the printed circuit board by soldering pin.

Referring to FIG. 2 again, the plug 20 includes a plug housing 21, a plurality of male contacts 22, and two second fixing contacts 23 received in the plug housing 21 respectively.

The plug housing 21 has a flat body 211, two sides of the body 211 define a plurality of male cavities 212 arranged at regular intervals along the longwise direction of the body 211 for receiving the male contacts 22 therein. Upper portions of two ends of the body 211 extends outward to form two pressing boards 213, each pressing board 213 defines two second fixing cavities 214 extending longitudinally and passing through the top and the bottom thereof, the junction of the pressing board 213 and the body 211 forms a shoulder 2131.

The second fixing contact 23 has a second basic portion 231 with a board shape, the top of one side of the second basic portion 231 extends outward to form a connecting portion 232, a free end of the connecting portion 232 extends downward to form a second inserting portion 233. The second fixing contact 23 is received in the second fixing cavity 214, the second basic portion 231 and the second inserting portion 233 protrude from the bottom of the second fixing cavity 214, the second inserting portion 233 is against the shoulder 2131.

Figure 9:
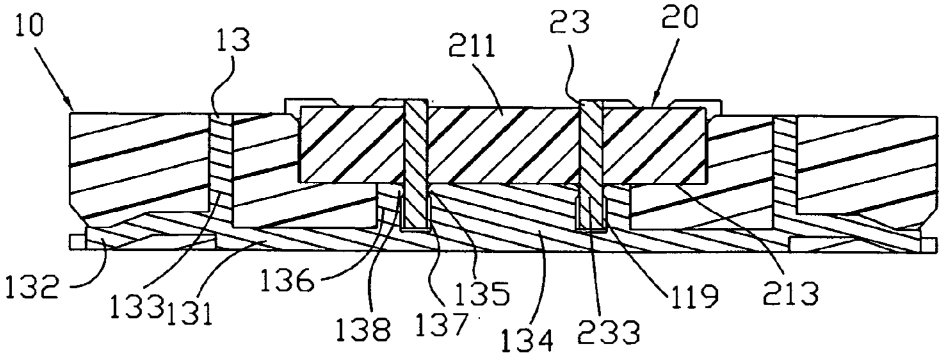
FIG. 9 is a cross-sectional view of the board-to-board connector assembly for clearly showing a first fixing cavity of the receptacle housing, a first fixing contact received in the first fixing cavity, a second fixing cavity of the plug housing and a second fixing contact received in the second fixing cavity.
Figure 10:
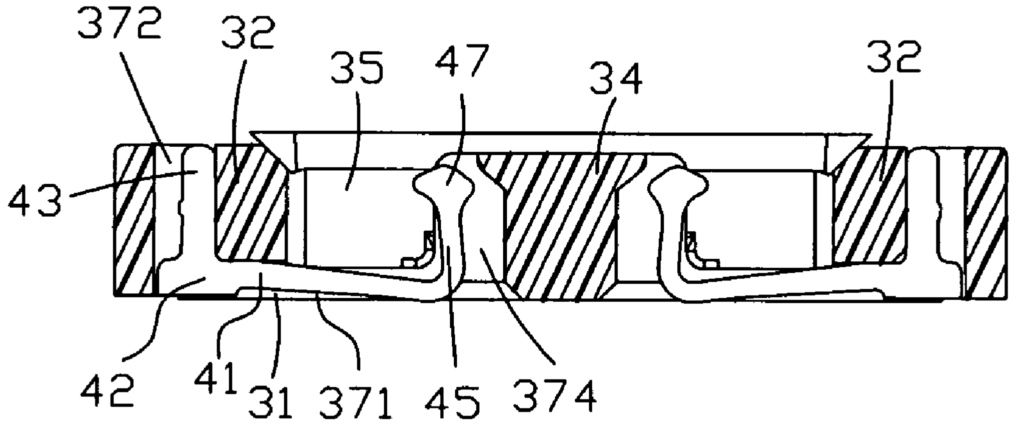
FIG. 10 (Prior Art)
FIG. 10 is a cross-sectional view of a prior board-to-board connector for clearly showing a contact received in a housing.

Please referring to FIG. 9, when the plug 20 engages with the receptacle 10, the body 211 of the plug housing 21 is inserted into the recess 114 of the receptacle 10, the two pressing boards 213 is against the top of the second sidewalls 113. The male contacts 22 are respectively against the first contacting heads 1216 of the first contacts 121 and the second contacting heads 1226 of the second contacts 122. The second basic portion 231 is inserted into the middle cavity 119 and the fixing space 137, and is against by the first thorn 135 and the second thorn 138 of the first fixing contact 13, therefore, the first and second fixing contacts 13, 23 are steadily fixed together, furthermore, the plug 20 and the receptacle 10 engage each other steadily, the reliability of an electrical connection therebetween is added.

As described above, because the contacting portion 1212, 1222 and the soldering portion 1213, 1223 are insulated by the first sidewall 112, the superfluous soldering tin is lead to the outside by the soldering portion 1213, 1223, and the third branch cavity 1173 or the third partial cavity 1183 when the soldering head 1217, 1227 is soldered on the printed circuit board by soldering pin. Therefore, the superfluous soldering tin do not flow to the contacting portion 1212, 1222, avoiding the electrical connection between the male contact 12 and the female contact 22.

While the present invention has been described with reference to a specific embodiment thereof, the description is illustrative and is not to be construed as limiting the invention. Various modifications to the present invention may be made to the preferred embodiment by those skilled in the art without departing from the true spirit and scope of the invention as defined by the appended claims.

What is claimed is:

1. A board-to-board connector assembly, comprising:

a receptacle having:

a receptacle housing having a fundus, two first sidewalls protruding upward from two opposite sides of the fundus, and two second sidewalls protruding upward from two opposite ends of the fundus, a recess being formed among the fundus and the sidewalls, a plurality of female cavities being defined in the first sidewalls, each of the female cavities having a first branch cavity defined transversely in the top of the first sidewall, a second branch cavity defined in an inner side of the first sidewall and communicating with the first branch cavity and the recess, and a third branch cavity extending downward and through the first sidewall from the first branch cavity, the second sidewall being disposed between the end of the two first sidewalls and lower than the first sidewall, two ends of the receptacle housing defining a first fixing cavity respectively for receiving a first fixing contact therein, the first fixing cavity having a basic cavity defined transversely in the second sidewall and the end of the two first sidewalls and passing through the top of the second sidewall and two middle cavities defined longitudinally in the top of the second sidewall and intersecting with the basic cavity, and a plurality of female contacts received in the respective female cavities of the receptacle housing, each female contact having a base extending transversely, one end of the base extending downward and then bend upward to form a contacting portion, the base further having a portion extending downward to form a soldering portion, the bottom of the soldering portion bending sideward to form a soldering head adapted to be soldered on a printed circuit board, wherein the base is received in the first branch cavity, the contacting portion is received in the second branch cavity and stretches into the recess, and the soldering portion is received in the third branch cavity; and a plug having a plug housing engaging the recess of the receptacle housing and male contacts received in the plug housing and electrically contacting the contacting portions of the female contacts.

2. The board-to-board connector assembly as claimed in claim 1, wherein the first fixing contact has a first basic portion extending transversely to form a strip shape, two sides of the first basic portion extend outward to form two welding portions, the middle of the first basic portion protrudes upward to form a fixing board, the top of two sides of the fixing board protrudes outward to form two first thorns, two fixing pillars protrude upward from the first basic portion and are adjacent to the two sides of the fixing board, two fixing spaces are formed between the fixing board and the two fixing pillars, the top of the fixing pillar protrudes into the fixing space to form a second thorn.

3. The board-to-board connector assembly as claimed in claim 2, wherein the junction of the first basic portion and the welding portion extends upward to form a first inserting portion, the end of the first sidewall defines a side hole communicating with the basic cavity for receiving the first inserting portion.

4. The board-to-board connector assembly as claimed in claim 2, wherein upper portions of two ends of the plug housing define two pressing boards for being against the top of the second sidewall of the receptacle housing, each pressing board defines two second fixing cavities extending longitudinally and passing through the top and the bottom thereof for receiving two second fixing contacts, the junction of the pressing board and the body forms a shoulder, the second fixing contact is inserted into the middle cavity and the fixing space and clasped by the first thorn and the second thorn of the first fixing contact.

5. The board-to-board connector assembly as claimed in claim 4, wherein the second fixing contact has a second basic portion with a board shape, the top of one side of the second basic portion extends outward to form a connecting portion, a free end of the connecting portion extends downward to form a second inserting portion, the second basic portion and the second inserting portion protrude from the bottom of the second fixing cavity, the second basic portion is inserted into the middle cavity and the fixing space, the second inserting portion is against the shoulder.

6. The board-to-board connector assembly as claimed in claim 1, wherein the female contact further has a fixing portion extending downward from the base, the female cavity further has a fourth branch cavity extending downward and into the first sidewall from the first branch cavity for receiving the fixing portion.

7. The board-to-board connector assembly as claimed in claim 6, wherein the fixing portion is spaced away from the contacting portion with the soldering portion located therebetween.

8. The board-to-board connector assembly as claimed in claim 7, wherein the soldering portion bends toward the contacting portion to form the soldering head.

9. The board-to-board connector assembly as claimed in claim 6, wherein the soldering portion extends downward from the base and is spaced away from the contacting portion, the fixing portion located between the contacting portion and the soldering portion.

10. The board-to-board connector assembly as claimed in claim 9, wherein the soldering portion bends toward one side opposite to the contacting portion to form the soldering head.

11. The board-to-board connector assembly as claimed in claim 1, wherein the contacting portion has an elastic portion, the top of the elastic portion protrudes towards one side opposite to the base to form a contacting head stretching into the recess.

12. The board-to-board connector assembly as claimed in claim 1, wherein the top of the first sidewall where the first branch cavity is defined is opposite to the wall opposite an opening, the soldering head is located at the bottom of the first sidewall opposite to the first branch cavity.

* * * * *